US009870893B2

(12) United States Patent
Colvin et al.

(10) Patent No.: US 9,870,893 B2
(45) Date of Patent: Jan. 16, 2018

(54) MULTI-PIECE ELECTRODE APERTURE

(71) Applicant: Axcelis Technologies, Inc., Beverly, MA (US)

(72) Inventors: Neil K Colvin, Merrimack, NH (US); Tseh-Jen Hsieh, Rowley, MA (US); Paul B. Silverstein, Somerville, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 15/410,707

(22) Filed: Jan. 19, 2017

(65) Prior Publication Data

US 2017/0207057 A1    Jul. 20, 2017

Related U.S. Application Data

(60) Provisional application No. 62/280,525, filed on Jan. 19, 2016.

(51) Int. Cl.
*H01J 37/04*       (2006.01)
*H01J 37/05*       (2006.01)
(Continued)

(52) U.S. Cl.
CPC ............ *H01J 37/045* (2013.01); *H01J 37/04* (2013.01); *H01J 37/05* (2013.01); *H01J 37/08* (2013.01);
(Continued)

(58) Field of Classification Search
USPC .......... 250/396 R, 423 R, 424, 505.1, 492.1, 250/492.21, 492.3
See application file for complete search history.

(56) References Cited

U.S. PATENT DOCUMENTS

| 2006/0022144 A1* | 2/2006 | Cha | H01J 27/024 250/426 |
| 2009/0236547 A1* | 9/2009 | Huang | H01J 37/20 250/492.21 |

(Continued)

FOREIGN PATENT DOCUMENTS

JP       2006004826 A    1/2006

OTHER PUBLICATIONS

International Search Report, International Application No. PCT/US2017/014098 dated Apr. 26, 2017.

*Primary Examiner* — Bernard Souw
(74) *Attorney, Agent, or Firm* — Eschwelier & Potashnik, LLC

(57) ABSTRACT

An optics plate for an ion implantation system, the optics plate comprising a pair of aperture assemblies. Each pair of aperture assemblies respectively comprises a first aperture member, a second aperture member; and an aperture fastener, wherein the aperture fastener fastens the first aperture member to the second aperture member. An aperture tip may be also fastened to the second aperture member. One or more of the first aperture member, second aperture member, aperture tip, and aperture fastener is made of one or more of a refractory metal, tungsten, lanthanated tungsten alloy, yttrium tungsten alloy, and/or graphite and silicon carbide. The aperture assemblies may define an extraction electrode assembly, a ground electrode assembly, or other electrode assembly in the ion implantation system. The aperture fastener may be a screw and a bevel washer. The first aperture member may be operably coupled to a base plate via an aperture assembly fastener.

18 Claims, 6 Drawing Sheets

(51) Int. Cl.
| | |
|---|---|
| *H01J 37/317* | (2006.01) |
| *H01J 37/08* | (2006.01) |
| *H01J 37/09* | (2006.01) |
| *H01J 37/12* | (2006.01) |
| *H01J 37/147* | (2006.01) |

(52) U.S. Cl.
CPC .............. *H01J 37/09* (2013.01); *H01J 37/12* (2013.01); *H01J 37/147* (2013.01); *H01J 37/3171* (2013.01)

(56) References Cited

U.S. PATENT DOCUMENTS

| | | | |
|---|---|---|---|
| 2009/0266997 A1* | 10/2009 | Tieger | H01J 27/024 250/396 R |
| 2015/0206701 A1* | 7/2015 | Schaller | H01J 37/05 250/505.1 |

* cited by examiner

MULTI-PIECE ELECTRODE APERTURE

REFERENCE TO RELATED APPLICATIONS

This application claims the benefit of U.S. Provisional Application No. 62/280,525 filed Jan. 19, 2016, entitled "MULTI-PIECE ELECTRODE APERTURE", the contents of which are herein incorporated by reference in their entirety.

FIELD

The present invention relates generally to ion implantation systems, and more specifically to multi-piece electrode apertures associated with a formation of an ion beam.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Extraction systems in conventional ion implantation systems comprise an electrode aperture plate that is typically a one-piece unit having an electrode aperture machined into the electrode aperture plate. As such, conventional electrode aperture plates are comprised of a solid piece of refractory metal or graphite having the electrode aperture defined therein.

SUMMARY

The present disclosure provides a system and apparatus associated with the formation of an ion beam in an ion beam implantation system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present disclosure is directed generally toward an ion implantation system and an electrode apparatus, also called an optics plate, wherein the electrode apparatus comprises a multi-piece electrode aperture assembly. The electrode apparatus may be configured as one or more of an extraction aperture, suppression aperture, and ground aperture associated with a formation of an ion beam.

In accordance with one exemplary aspect of the disclosure, the electrode apparatus comprises a pair of aperture assemblies. Each of the pair of aperture assemblies respectively comprises a first aperture member and a second aperture member. The first aperture member to the second aperture member, for example, are selectively coupled to one another via one or more aperture fasteners. Accordingly, one or more of the first aperture member and second aperture member may be selectively replaced without replacing the remaining of the first aperture member and second aperture member.

According to one example, one or more of the first aperture member, second aperture member, and aperture fastener comprises one or more of a refractory metal, tungsten, tungsten lanthanum alloy, tungsten yttrium alloy, graphite or silicon carbide. In another example, the aperture fastener is comprised of a refractory metal. The aperture fastener may comprise a screw and a bevel washer, whereby the bevel washer permits thermal expansion of one or more of the first aperture member, second aperture member, and screw, while still maintaining the coupling thereof.

In one example, the first aperture member is comprised of graphite or silicon carbide, and the second aperture member is comprised of one or more of a refractory metal, tungsten, tungsten lanthanum alloy, and tungsten yttrium alloy. In another example, a tip is further selectively coupled to the second aperture member, wherein the tip is primarily exposed to the ion beam.

The pair of aperture assemblies, for example, collectively define one of an extraction electrode assembly and a ground electrode assembly. The first aperture member, for example, may be operably coupled to the base plate via an aperture assembly fastener.

According to another exemplary aspect, an ion implantation system is provided, comprising an ion source configured to form an ion beam and an optics plate configured to be exposed to the ion beam, whereby the optics plate is configured as provided previously.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
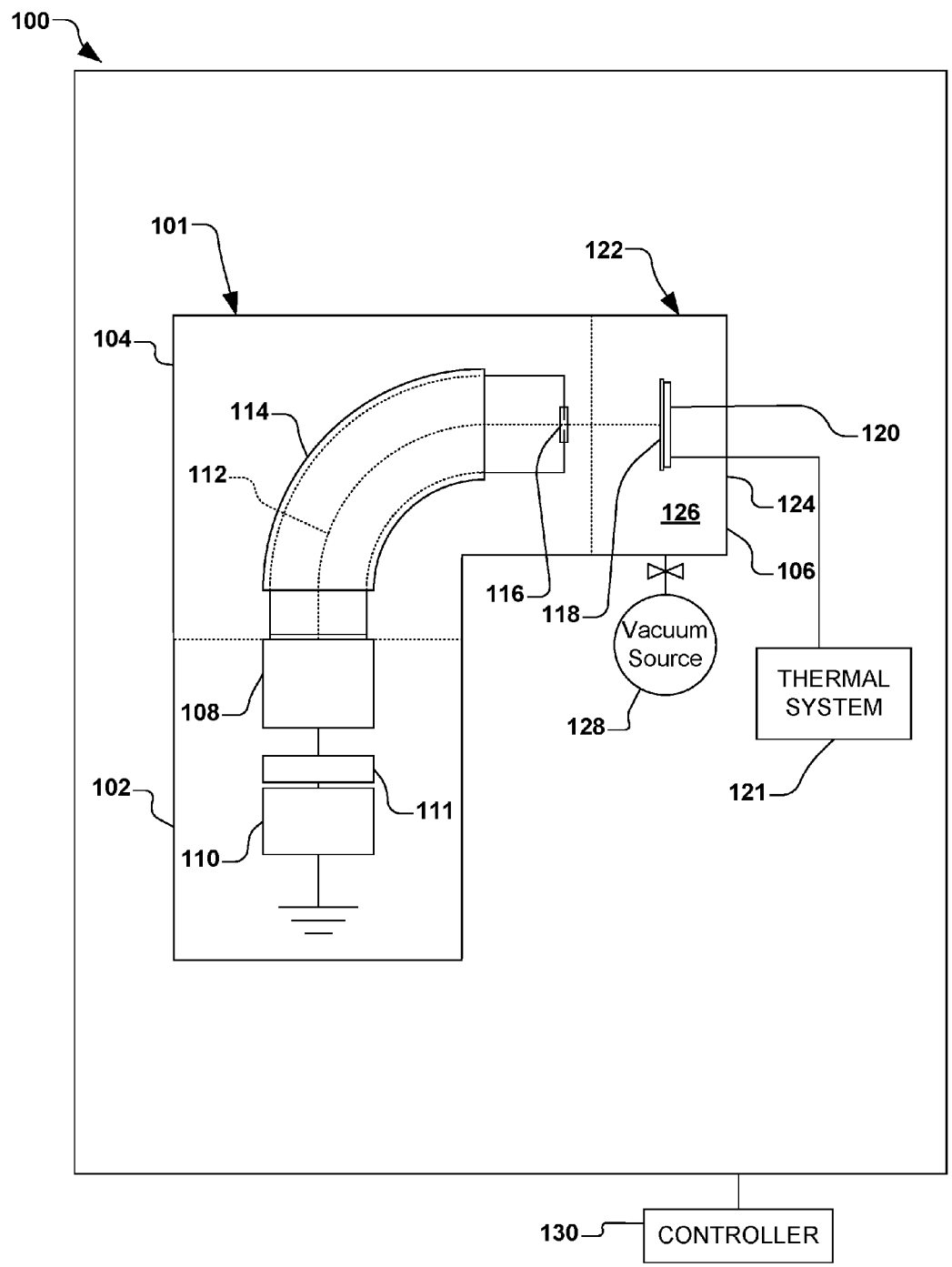
FIG. 1 is a block diagram of an exemplary vacuum system utilizing an optics plate in accordance with several aspects of the present disclosure.

The present disclosure is directed generally toward an ion implantation system and electrode apparatus, wherein the electrode apparatus has a multi-piece electrode aperture. The electrode apparatus may be configured as one or more of an extraction aperture, suppression aperture, and ground aperture associated with a formation of an ion beam.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, elements or other physical or functional units shown in the drawings or described herein could also be implemented by an indirect connection or coupling. Furthermore, it is to be appreciated that functional blocks or units shown in the drawings may be implemented as separate features in one embodiment, and may also or alternatively be fully or partially implemented in a common feature in another embodiment.

In accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110 to ionize a dopant gas into a plurality of ions and wherein an extraction electrode 111 aperture extracts positively charged ions from the ion source to form an ion beam 112. Individual electrodes in close proximity to the extraction electrode may be biased to inhibit back streaming of neutralizing electrons close to the source or back to the extraction electrode. It will be understood that the extraction electrode 111 may comprise one or more of an extraction aperture, suppression aperture, and ground aperture, as will be discussed infra.

The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber. Further, a controller 130 is provided for overall control of the vacuum system 100.

Figure 2:
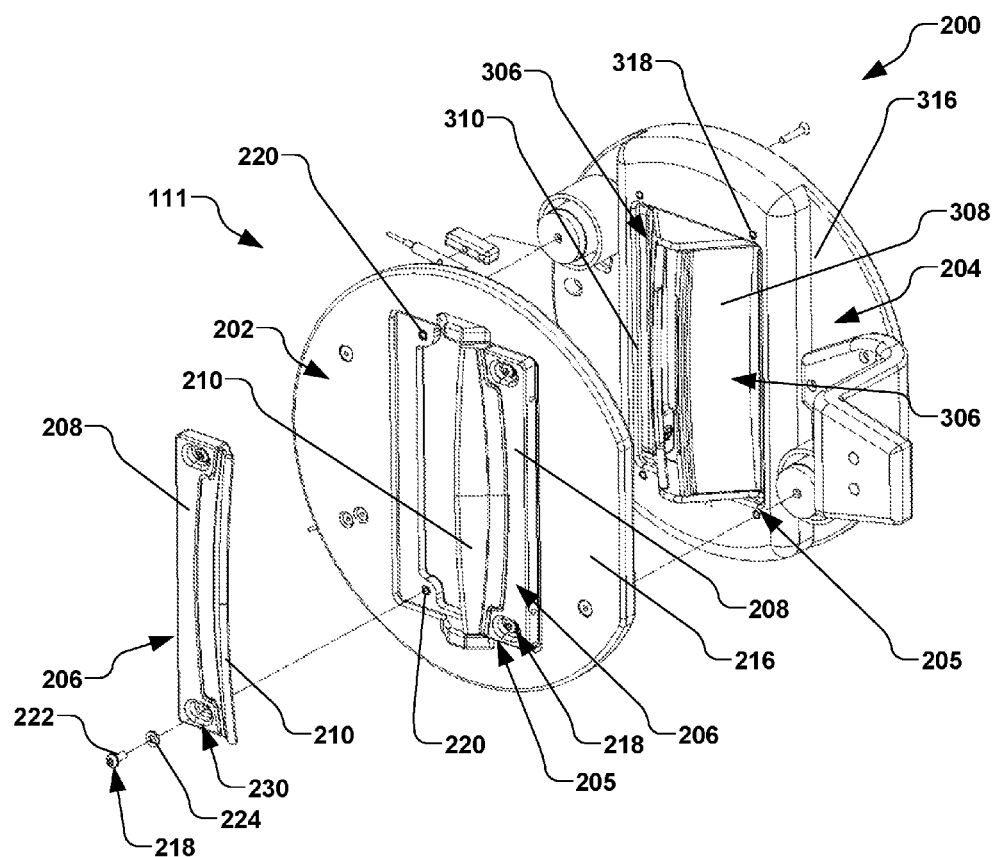
FIG. 2 illustrates an exemplary optics assembly, in accordance with another aspect.

In accordance with several aspects of the present disclosure, FIG. 2 illustrates an exemplary extraction electrode assembly 200, such as the extraction electrode 111 of FIG. 1. As illustrated in FIG. 2, the extraction electrode assembly 200 is shown in a blown up view comprising a suppression electrode 202 and a ground electrode 204. It should be noted that the extraction electrode assembly 200 may comprise any number electrodes having a multitude of functions, and any such additional electrodes are contemplated as falling within the scope of the present disclosure. It should be further noted that the suppression electrode 202 and ground electrode 204 may be generically called "optics plates" 205, wherein the optics plates are configured to selectively control the extraction and formation of the ion beam 112 of FIG. 1. As such, the following examples may be implemented in additional or alternative optics plates 205, as will be understood by one of ordinary skill upon viewing of the present disclosure.

Figure 3A:
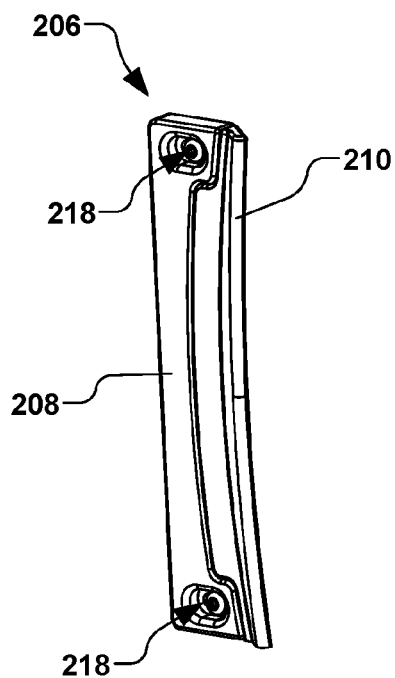
FIGS. 3A-3B illustrate an exemplary suppression electrode aperture assembly, in accordance with another aspect.
Figure 3B:
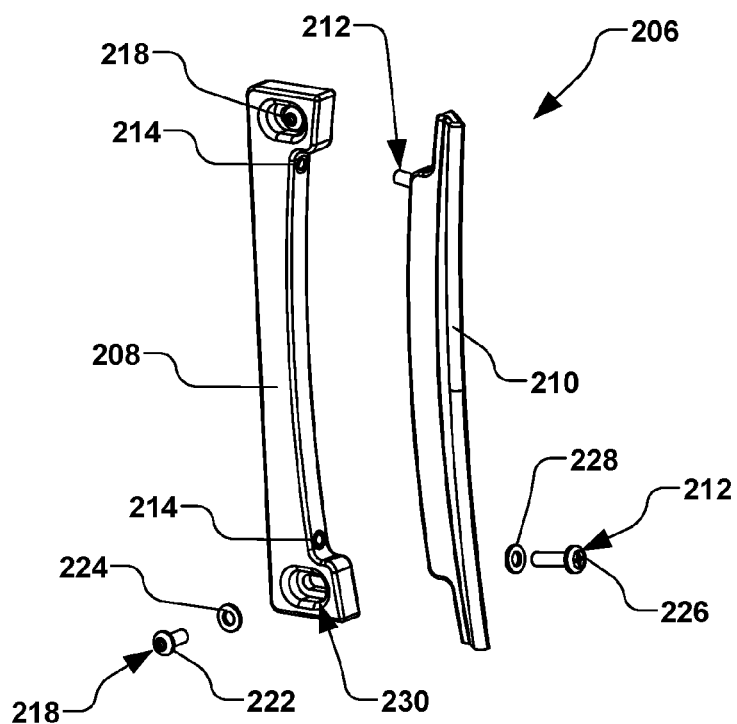
Figure 5A:
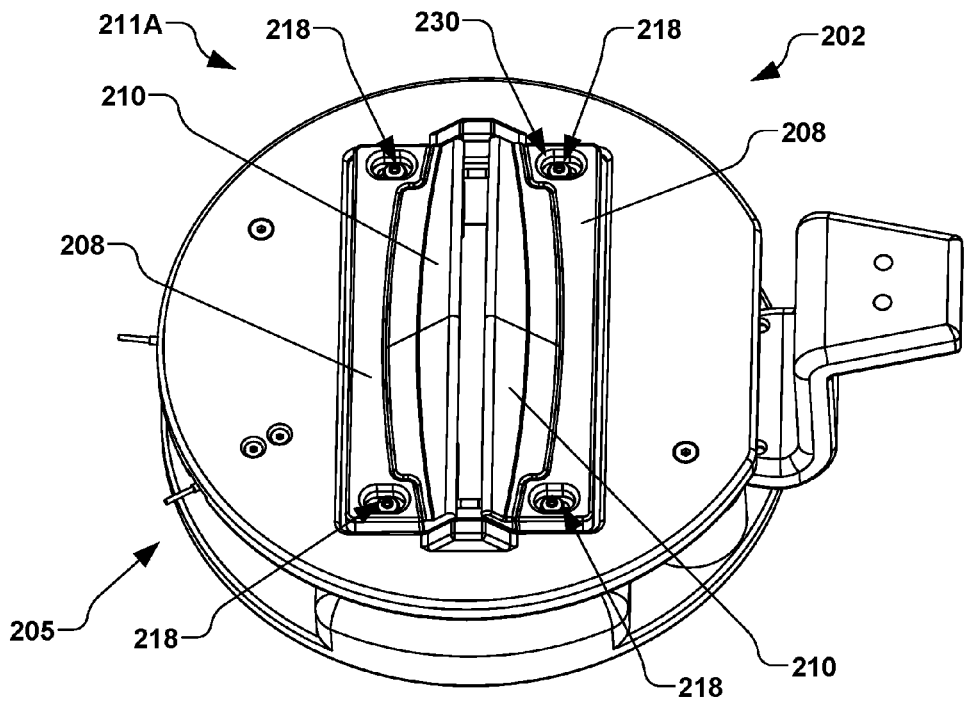
FIGS. 5A-5B illustrate respective top and backside/downstream views of an exemplary suppression electrode aperture assembly, in accordance with another aspect.
Figure 5B:
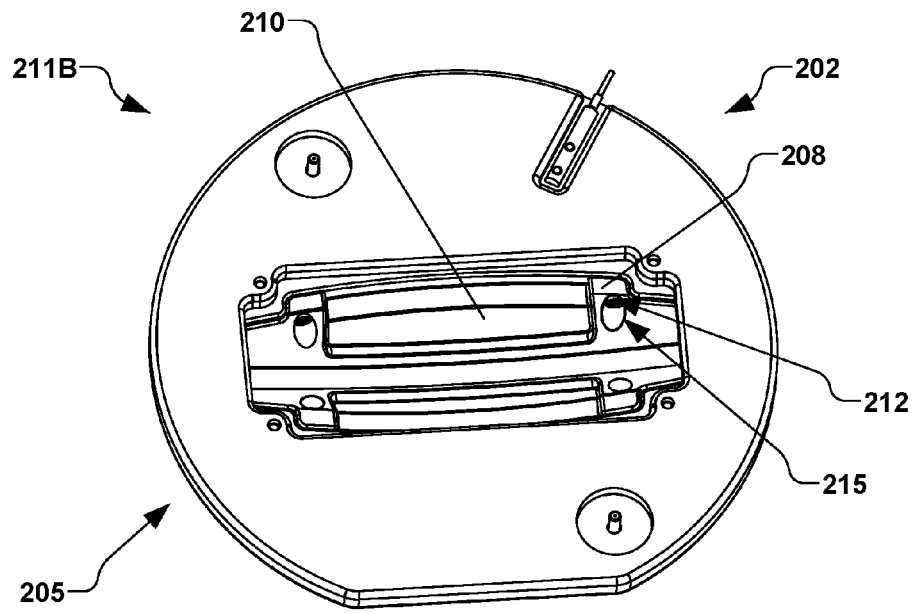

As illustrated in FIG. 2, the suppression electrode 202 comprises a pair of suppression electrode aperture assemblies 206 (e.g., substantial mirror images of one another). In the present example, each suppression electrode aperture assembly 206 comprises a first suppression member 208 and second suppression member 210, as illustrated in FIGS. 3A and 3B. FIGS. 5A and 5B further illustrate a respective front view 211A and a rear view 211B of the suppression electrode 202.

The first suppression member 208 and second suppression member 210 are operably coupled to one another via one or more suppression aperture fasteners 212, as illustrated in FIG. 3B. The first suppression member 208, for example, comprises one or more first suppression fastening apertures 214 (e.g., one or more threaded holes), whereby the one or more suppression aperture fasteners 212 are configured to selectively engage the one or more first suppression fastening apertures to selectively secure the second suppression member 210 to the first suppression member 208. One or more of the first suppression member 208, second suppression member 210, and one more suppression aperture fasteners 212, for example, are comprised of a refractory metal (e.g., tungsten).

The second suppression member 210, for example, comprises a recess 215 illustrated in FIG. 5B, whereby the one or more suppression aperture fasteners 212 are recessed into the second suppression member to generally prevent a strike of the ion beam 112 of FIG. 1 on the one or more suppression aperture fasteners. In one particular example, one or more of the first suppression member 208, second suppression member 210, and suppression aperture fasteners 212 are comprised of a refractory metal such as lanthanated tungsten, tungsten or tantalum.

The suppression electrode aperture assemblies 206, for example, are further operably coupled to a suppression base plate 216 via one or more suppression assembly fasteners 218 illustrated in FIG. 2. The one or more suppression assembly fasteners 218, for example, are comprised of a refractory metal such as lanthanated tungsten, tungsten or tantalum. In the present example, the suppression base plate 216 is comprised of one or more of graphite and silicon carbide. The suppression base plate 216, for example, comprises one or more second suppression fastening apertures 220, and each of the one or more suppression assembly fasteners 218 comprises a first suppression securing member 222 (e.g., a screw) and a first suppression biasing member 224 (e.g., a bevel washer). The one or more suppression assembly fasteners 218, for example, are configured to respectively selectively engage the one or more second suppression fastening apertures 220 in the suppression base plate 216, thereby selectably fastening the suppression electrode aperture assemblies 206 to the suppression base plate.

In accordance with one exemplary aspect of the disclosure, the first suppression biasing member 224 is configured to provide a spring force between the suppression base plate 216 and the respective first suppression securing member 220 and suppression electrode aperture assembly 206. The spring force provided by the first suppression biasing member 224, for example, generally ensures adequate fastening, such as in a scenario where the suppression assembly fasteners 218 expand in length due to high temperatures.

Similarly, the one or more suppression aperture fasteners 212 illustrated in FIG. 3B may comprise a second suppression securing member 226 (e.g., a screw) and a second suppression biasing member 228 (e.g., a bevel washer). The second suppression biasing member 228, for example, is further configured to provide a spring force between the first suppression member 208, second suppression member 210, and the second suppression securing member 226, where the spring force likewise generally ensures adequate fastening when thermal expansion occurs due to variations in temperature. The respective first suppression member 208 may further comprise a recess 230, whereby the one or more suppression assembly fasteners 218, for example, are recessed into the respective first suppression member to generally mitigate a strike of the ion beam 112 of FIG. 1 on the one or more suppression aperture fasteners.

In accordance with the present disclosure, since the first suppression member 208 and second suppression member 210 are selectably coupled to one another, each may be replaced individually. The present disclosure, for example, contemplates the first suppression member 208 and second suppression member 210 of FIG. 2 being comprised of one or more of graphite, silicon carbide, and a refractory material, such as lanthanated tungsten, tungsten, tungsten yttrium alloy or tantalum. As such, optics components such as the second suppression member 210 that are more often exposed to strikes of the ion beam 112 of FIG. 1 may be replaced, while other components such as the first suppression member 208 and base 206 may be re-used, thus providing a cost-savings to previously-known apparatuses. For example, the second suppression member 210 may be comprised of a refractory metal, while the first suppression member 208 may be comprised of graphite or silicon carbide, or vice versa. Alternatively, the first suppression member 208 and second suppression member 210 may be comprised of the same material (e.g., graphite, silicon carbide, or refractory material).

Figure 4A:
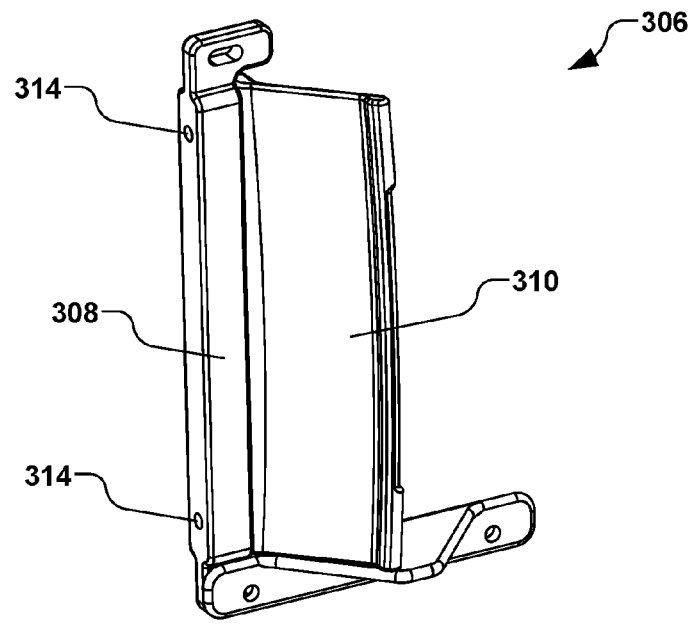
FIGS. 4A-4B illustrate an exemplary ground electrode aperture assembly, in accordance with another aspect.
Figure 4B:
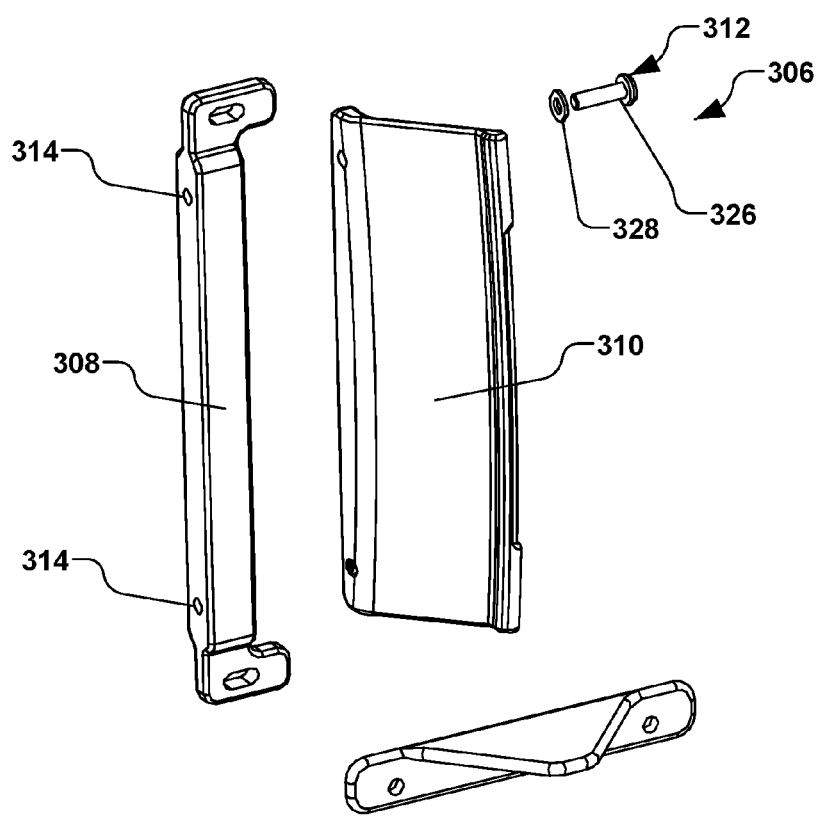
Figure 6A:
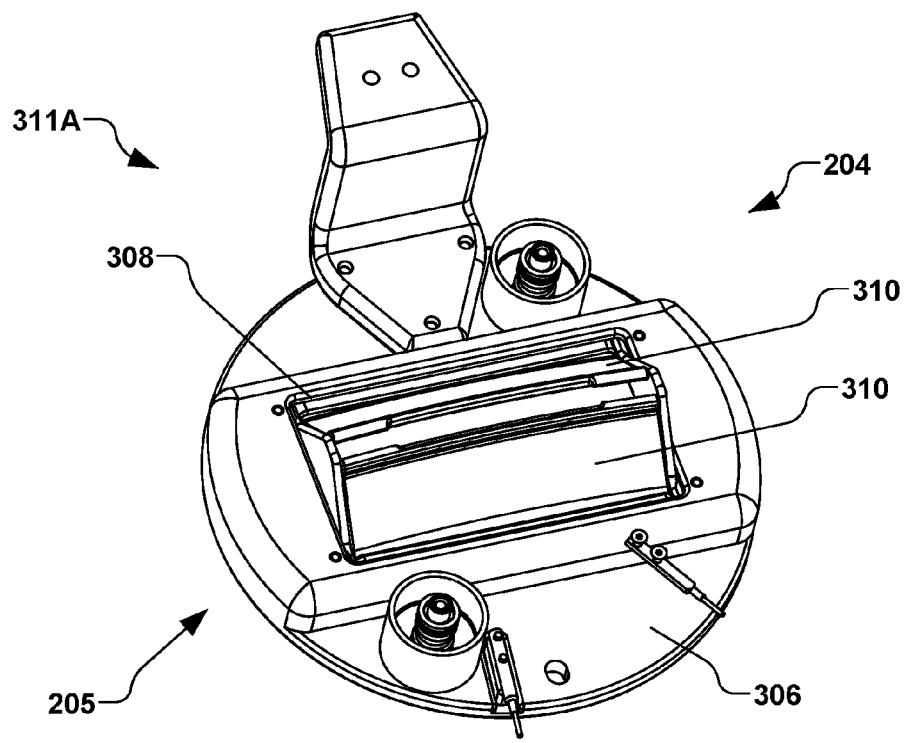
FIGS. 6A-6B illustrate respective top and backside/downstream views of an exemplary ground electrode aperture assembly, in accordance with another aspect.
Figure 6B:
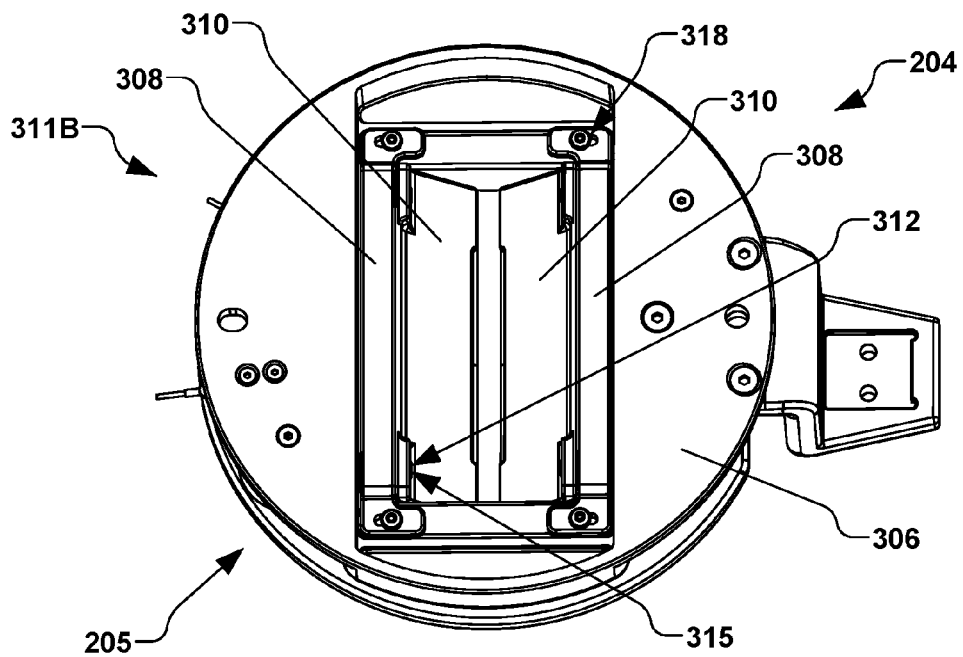

In accordance with another exemplary aspect of the disclosure, FIGS. 4A and 4B illustrate the ground electrode 204 of FIG. 2, whereby the ground electrode comprises a pair of ground electrode aperture assemblies 306 (e.g., substantial mirror images of one another). FIGS. 6A and 6B further illustrate a respective front view 311A and a rear view 311B of the ground electrode 202.

Each ground electrode aperture assembly 306, for example, comprises a first ground member 308 and second ground member 310 operably coupled to one another via one or more ground aperture fasteners 312, as illustrated in FIG. 4B. The first ground member 308, for example, comprises one or more first ground fastening apertures 314 (e.g., one or more threaded holes), whereby the one or more ground aperture fasteners 312 are configured to selectively engage the one or more first ground fastening apertures to selectively secure the second ground member 310 to the first ground member 308. One or more of the first ground member 308, second ground member 310, and one more ground aperture fasteners 312, for example, are comprised of a refractory metal (e.g., tungsten).

The second ground member 310, for example, comprises a recess 315 illustrated in FIG. 6B, whereby the one or more ground aperture fasteners 312 are recessed into the second ground member to generally prevent a strike of the ion beam 112 of FIG. 1 on the one or more ground aperture fasteners. In one particular example, one or more of the first ground member 308, second ground member 310, and ground aperture fasteners 312 are comprised of a refractory metal such as lanthanated tungsten, tungsten or tantalum.

The ground electrode aperture assemblies 306, for example, are further operably coupled to a ground base plate 316 via one or more ground assembly fasteners 318 illustrated in FIG. 2. The one or more ground assembly fasteners 318, for example, are comprised of a refractory metal such as lanthanated tungsten, tungsten or tantalum. In the present example, the ground base plate 316 is comprised of one or more of graphite or silicon carbide. The ground base plate 316, for example, comprises one or more second ground fastening apertures 320, and each of the one or more ground assembly fasteners 318 comprises a first ground securing member 322 (e.g., a screw) and a first ground biasing member 324 (e.g., a bevel washer). The one or more ground assembly fasteners 318, for example, are configured to respectively selectively engage the one or more second ground fastening apertures 320 in the ground base plate 316, thereby selectably fastening the ground electrode aperture assemblies 306 to the ground base plate.

In accordance with one exemplary aspect of the disclosure, the first ground biasing member 324 is configured to provide a spring force between the ground base plate 316 and the respective first ground securing member 320 and ground electrode aperture assembly 306. The spring force provided by the first ground biasing member 324, for example, generally ensures adequate fastening, such as in a scenario where the ground assembly fasteners 318 expand in length due to high temperatures.

Similarly, the one or more ground aperture fasteners 312 illustrated in FIG. 4B may comprise a second ground securing member 326 (e.g., a screw) and a second ground biasing member 328 (e.g., a bevel washer). The second ground biasing member 328, for example, is further configured to provide a spring force between the first ground member 308, second ground member 310, and the second ground securing member 326, where the spring force likewise generally ensures adequate fastening when thermal expansion occurs due to variations in temperature. The respective first ground member 308 may further comprise a recess 330, whereby the one or more ground assembly fasteners 318, for example, are recessed into the respective first ground member to generally mitigate a strike of the ion beam 112 of FIG. 1 on the one or more ground aperture fasteners.

In accordance with the present disclosure, since the first ground member 308 and second ground member 310 are selectably coupled to one another, each may be replaced individually. The present disclosure, for example, contemplates the first ground member 308 and second ground member 310 of FIG. 2 being comprised of one or more of graphite, silicon carbide, and a refractory material, such as lanthanated tungsten, tungsten or tantalum. As such, optics components such as the second ground member 310 that are more often exposed to strikes of the ion beam 112 of FIG. 1 may be replaced, while other components such as the first ground member 308 and base 306 may be re-used, thus providing a cost-savings to previously-known apparatuses. For example, the second ground member 310 may be comprised of a refractory metal, while the first ground member 308 may be comprised of graphite or silicon carbide, or vice versa. Alternatively, the first ground member 308 and second ground member 310 may be comprised of the same material (e.g., graphite, silicon carbide, or refractory material).

Thus, in accordance with the present disclosure, the optics plates 205, being consumable components of the ion implantation system 101 of FIG. 1, provide electrode apertures comprised of multiple pieces (e.g., first suppression member 208, second suppression member 210, first ground member 308, second ground member 310, etc.), whereby cost savings may be achieved. The present disclosure advantageously provides lowered machining set up time and less raw material waste via the present optics plates 205, thus resulting in a substantial cost savings, as compared to conventional optics. For example, conventional electrode optics are made from a single, contiguous refractory metal such as tungsten, or from graphite or silicon carbide. Such a conventional electrode would be considered a "consumable", whereby the entire electrode would be replaced when worn.

In accordance with the present disclosure, the individual components of the optics plates 205 can be easily replaced or changed to other types of materials such as a refractory metal, tungsten, tungsten lanthanum alloy, tungsten yttrium alloy, etc. As such, it will be appreciated that the components of the optics plates 205 that are exposed to wear (e.g., the second suppression member or second ground member that are exposed to an ion beam or other medium) may be easily replaced at greater intervals without replacement of other components (e.g., the first suppression member or first ground member). Accordingly, savings in refractory metal costs may be advantageously achieved, as significantly less material is wasted during such replacement.

Furthermore, it will be appreciated that additional suppression members (not shown) and/or additional ground members (not shown) may be provided whereby such additional members of the optics plates may endure the greatest exposure to the ion beam. Such additional members, or "tips", may be comprised of a refractory metal, while the remaining portion of the electrode is comprised of graphite or a refractory metal. The tips, for example, may be selectively coupled to the respective second suppression member or second ground member in a similar manner as the first and second suppression members and ground members described above. As such, additional savings may be achieved in consumable material and cost, as the amount of refractory metal that is consumed may minimized, while still achieving the desired qualities associated with the refractory metal.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:
1. An optics plate for an ion implantation system, the optics plate comprising:
a pair of aperture assemblies, each pair of aperture assemblies respectively comprising:
a first aperture member;
a second aperture member; and
an aperture fastener, wherein the aperture fastener selectively couples the first aperture member to the second aperture member.

2. The optics plate of claim 1, wherein one or more of the first aperture member, second aperture member, and aperture fastener comprises one or more of a refractory metal, tungsten, tungsten lanthanum alloy, tungsten yttrium alloy, graphite and silicon carbide.

3. The optics plate of claim 1, wherein the aperture fastener is comprised of a refractory metal.

4. The optics plate of claim 1, wherein the pair of aperture assemblies define an extraction electrode assembly.

5. The optics plate of claim 1, wherein the pair of aperture assemblies define a ground electrode assembly.

6. The optics plate of claim 1, wherein the aperture fastener comprises a screw and a bevel washer.

7. The optics plate of claim 1, further comprising a base plate, wherein the first aperture member is operably coupled to the base plate via an aperture assembly fastener.

8. The optics plate of claim 1, wherein the first aperture member is comprised of graphite or silicon carbide, and the second aperture member is comprised of one or more of a refractory metal, tungsten, tungsten lanthanum alloy, and tungsten yttrium alloy.

9. The optics plate of claim 1, further comprising a tip selectively coupled to the second aperture member.

10. An ion implantation system, comprising:
an ion source configured to form an ion beam; and
an optics plate configured to be exposed to the ion beam, the optics plate, comprising:
a pair of aperture assemblies, each pair of aperture assemblies respectively comprising:
a first aperture member;
a second aperture member; and
an aperture fastener, wherein the aperture fastener selectively couples the first aperture member to the second aperture member.

11. The ion implantation system of claim 10, wherein one or more of the first aperture member, second aperture member, and aperture fastener comprises one or more of a refractory metal, tungsten, tungsten lanthanum alloy, tungsten yttrium alloy, graphite or silicon carbide.

12. The ion implantation system of claim 10, wherein the aperture fastener is comprised of a refractory metal.

13. The ion implantation system of claim 10, wherein the pair of aperture assemblies define an extraction electrode assembly.

14. The ion implantation system of claim 10, wherein the pair of aperture assemblies define a ground electrode assembly.

15. The ion implantation system of claim 10, wherein the aperture fastener comprises a screw and a bevel washer.

16. The ion implantation system of claim 10, further comprising a base plate, wherein the first aperture member is operably coupled to the base plate via an aperture assembly fastener.

17. The ion implantation system of claim 10, wherein the first aperture member is comprised of graphite or silicon carbide, and the second aperture member is comprised of one or more of a refractory metal, tungsten, tungsten lanthanum alloy, and tungsten yttrium alloy.

18. The ion implantation system of claim 10, further comprising a tip selectively coupled to the second aperture member, wherein the tip is primarily exposed to the ion beam.

* * * * *